(12) United States Patent
Kasuya

(10) Patent No.: US 6,784,078 B2
(45) Date of Patent: Aug. 31, 2004

(54) METHODS FOR MANUFACTURING SEMICONDUCTOR DEVICES AND SEMICONDUCTOR DEVICES

(75) Inventor: Yoshikazu Kasuya, Sakutu (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/963,924

(22) Filed: Sep. 26, 2001

(65) Prior Publication Data

US 2002/0084498 A1 Jul. 4, 2002

(30) Foreign Application Priority Data

Sep. 26, 2000 (JP) ........................................ 2000-292143

(51) Int. Cl.[7] .......................... H01L 21/76; H01L 21/46; H01L 21/30
(52) U.S. Cl. ........................ 438/435; 438/436; 438/438; 438/440
(58) Field of Search .............................. 438/435, 436, 438/438, 440, 197, 585, 586, 595, 596

(56) References Cited

U.S. PATENT DOCUMENTS

| | | | | |
|---|---|---|---|---|
| 4,786,609 A | * | 11/1988 | Chen ........................... | 438/303 |
| 5,306,655 A | * | 4/1994 | Kurimoto .................... | 438/302 |
| 5,391,510 A | | 2/1995 | Hsu et al. ..................... | 437/44 |
| 5,405,787 A | * | 4/1995 | Kurimoto .................... | 438/302 |
| 5,434,093 A | | 7/1995 | Chau et al. ................... | 437/41 |
| 5,721,443 A | * | 2/1998 | Wu .............................. | 257/344 |
| 5,879,998 A | * | 3/1999 | Krivokapic ................. | 438/300 |
| 5,937,299 A | * | 8/1999 | Michael et al. ............. | 438/299 |
| 5,960,270 A | * | 9/1999 | Misra et al. ................. | 438/197 |
| 5,976,934 A | * | 11/1999 | Hayakawa ................... | 438/258 |
| 5,986,302 A | * | 11/1999 | Fukatsu et al. .............. | 257/315 |
| 6,087,231 A | * | 7/2000 | Xiang et al. ................. | 438/287 |
| 6,228,717 B1 | * | 5/2001 | Hazama et al. .............. | 438/265 |
| 6,271,094 B1 | * | 8/2001 | Boyd et al. .................. | 438/287 |
| 6,348,385 B1 | * | 2/2002 | Cha et al. .................... | 438/287 |
| 6,365,459 B1 | * | 4/2002 | Leu .............................. | 438/268 |
| 6,403,997 B1 | | 6/2002 | Inumiya et al. ............. | 257/288 |
| 6,465,359 B2 | | 10/2002 | Yamada et al. .............. | 438/706 |

FOREIGN PATENT DOCUMENTS

JP        4-155932        5/1992        ......... H01L/21/336

OTHER PUBLICATIONS

U.S. application Ser. No. 09/963,168, filed Sep. 26, 2001, having U.S. patent Appl. Pub. No. US2002/0084476 A1, published on Jul. 4, 2002, and pending claims.
U.S. application Ser. No. 09/963,903, filed Sep. 26, 2001, having U.S. patent Appl. Pub. No. US2002/0117726 A1, published on Aug. 29, 2002.

\* cited by examiner

Primary Examiner—Long Pham
Assistant Examiner—Shrinivas H. Rao
(74) Attorney, Agent, or Firm—Konrad Raynes & Victor, LLP; Alan S. Raynes

(57) ABSTRACT

Semiconductor devices and methods for manufacturing the same in which deterioration of the electrical characteristic is suppressed are described. One method for manufacturing a semiconductor device includes the steps of: forming a first polysilicon layer 32 on a gate dielectric layer 20; forming a silicon nitride layer 92 on the first polysilicon layer 32; forming a second polysilicon layer 94 on the silicon nitride layer 92; forming sidewall spacers; forming an insulation layer 60 that covers the second polysilicon layer 94; planarizing the insulation layer 60 until an upper surface of the second polysilicon layer 94 is exposed; removing the second polysilicon layer 94; removing the silicon nitride layer 92 to form a recessed section 80; and filling a metal layer 34 in the recessed section 80 to form a gate electrode 30 that includes at least the first polysilicon layer 32 and the metal layer 34.

25 Claims, 9 Drawing Sheets

Fig. 10 (a) (prior art)
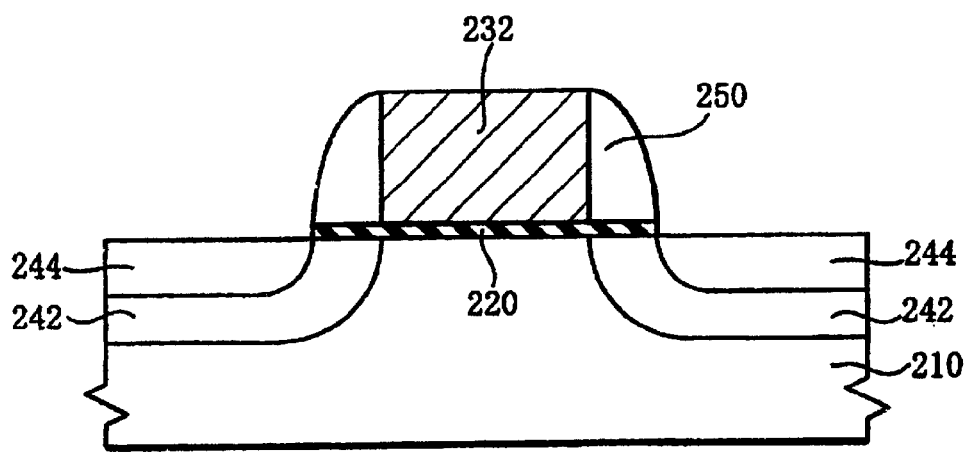
Fig. 10 (b) (prior art)
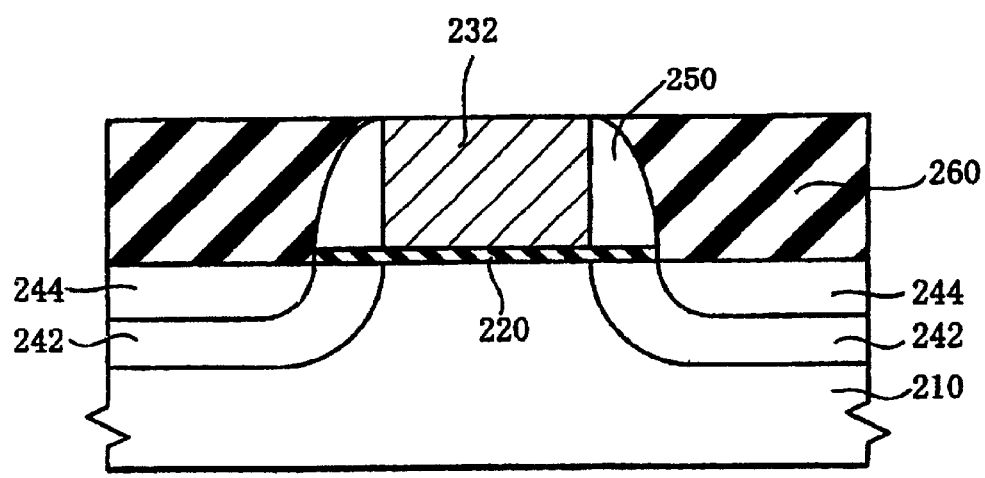

Fig. 11 (a) (prior art)
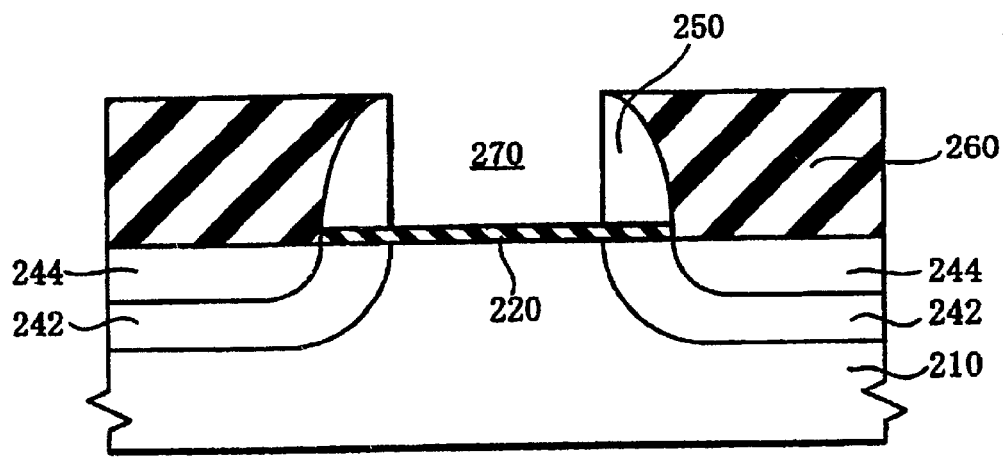
Fig. 11 (b) (prior art)
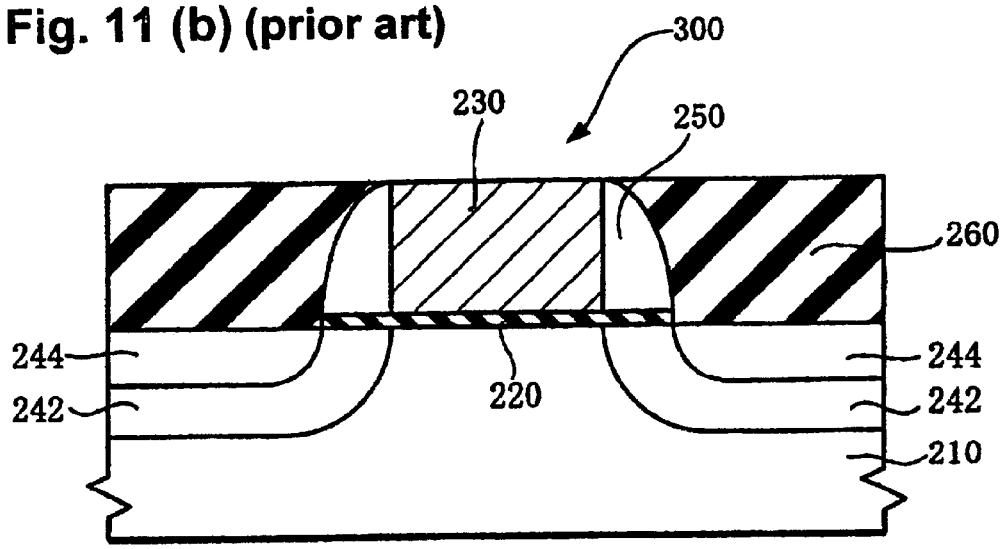

METHODS FOR MANUFACTURING SEMICONDUCTOR DEVICES AND SEMICONDUCTOR DEVICES

Applicant hereby incorporates by reference Japanese Application No. 2000-292143, filed Sep. 26, 2000, in its entirety. Applicant hereby incorporates by reference U.S. application Ser. No. 09/963,168 in its entirety. Applicant hereby incorporates by reference U.S. application Ser. No. 09/963,903 in its entirety.

TECHNICAL FIELD

The present invention relates to semiconductor devices having a field effect transistor and methods for manufacturing the same, and more particularly, to semiconductor devices having a gate electrode that is formed from two or more layers and methods for manufacturing the same.

RELATED ART

Currently, there is a technique in which a gate electrode 230 of a MOS transistor 300 shown in FIG. 11(b) is formed by a so-called damascene method. One example of a method for manufacturing a MOS transistor 300 using a technique in which its gate electrode 230 is formed by a damascene method is described below.

As shown in FIG. 10(a), a gate dielectric layer 220 (also sometimes referred to as a gate insulation layer) and a dummy electrode 232 are formed on a silicon substrate 210. Next, the dummy electrode 232 is patterned. Then, a low concentration impurity diffusion layer 242 is formed in the silicon substrate 210 on the sides of the dummy electrode 232. Next, an insulation layer is formed over the entire surface, and the insulation layer and the gate dielectric layer 220 are etched by RIE to form sidewall spacers 250 on the side walls of the dummy electrode 232. Then, a high concentration impurity diffusion layer 244 is formed in the silicon substrate 210 on the sides of the sidewall spacers 250.

Next, as shown in FIG. 10(b), an insulation layer 260 is formed on the silicon substrate 210, and the insulation layer 260 is then planarized to expose the dummy electrode 232.

Next, as shown in FIG. 11(a), the entire dummy electrode 232 is removed to form a through hole 270.

Next, as shown in FIG. 11(b), a metal layer is formed in a manner to fill the through hole 270, and the metal layer is then etched-back to form a gate electrode 230.

Techniques to form gate electrodes by a damascene method are described in references such as U.S. Pat. Nos. 5,960,270, 5,391,510, 5,434,093.

SUMMARY

Embodiments include a method for manufacturing a semiconductor device, the method including forming a gate dielectric layer and forming a first conduction layer on the gate dielectric layer. The method also includes forming a first upper layer comprising a material different from the first conduction layer on the first conduction layer, and forming a second upper layer comprising a material different from the first upper layer on the first upper layer. Sidewall spacers are formed on side walls of the first conduction layer, the first upper layer and the second upper layer. The method also includes forming an insulation layer that covers the second upper layer and the sidewall spacers, and planarizing the insulation layer until an upper surface of the second upper layer is exposed. The method also includes removing the second upper layer, and removing the first upper layer to form a recessed section between the sidewall spacers. A second conduction layer is formed in the recessed section to form a gate electrode that includes at least the first conduction layer and the second conduction layer.

Embodiments also include a method for manufacturing a semiconductor device, the method including forming a gate dielectric layer and forming a first conduction layer on the gate dielectric layer. The method also includes forming an upper layer on the first conduction layer. At least a lower portion of the upper layer comprises a material different from at least an upper portion of the first conduction layer. Sidewall spacers are formed on side walls of the first conduction layer and the upper layer. An insulation layer is formed that covers the upper layer and the sidewall spacers. The insulation layer is planarized until an upper surface of the upper layer is exposed. The upper layer is removed to form a recessed section between the sidewall spacers on an upper portion of the first conduction layer. A second conduction layer is formed in the recessed section to form a gate electrode that includes at least the first conduction layer and the second conduction layer.

Embodiments also include a method for manufacturing a semiconductor device, the method including forming a gate dielectric layer and forming a first conduction layer on the gate dielectric layer. An upper layer is formed on the first conduction layer, the upper layer comprising a material different from that of the first conduction layer. Sidewall spacers are formed on side walls of the first conduction layer and the upper layer. The upper layer is removed to form a recessed section between the sidewall spacers and above at least part of the first conduction layer. A second conduction layer is formed in the recessed section to form a gate electrode comprising the at least part of the first conduction layer and the second conduction layer.

Other embodiments include a semiconductor device including a field effect transistor, the field effect transistor including a gate dielectric layer, a gate electrode, sidewall spacer regions, a source region, and a drain region. The gate electrode includes a first conduction layer and a second conduction layer. The first conduction layer is formed on the gate dielectric layer. The second conduction layer is formed above the first conduction layer. The sidewall spacer regions are formed on side walls of the gate electrode. An insulation layer is provided adjacent to the sidewall spacer regions. A barrier layer is provided between the first conduction layer and the second conduction layer and between the second conduction layer and the sidewall spacer regions.

Embodiments also include a semiconductor device including a field effect transistor, the field effect transistor including a gate dielectric layer, a gate electrode, sidewall spacers, a source region, and a drain region. The gate electrode includes a first conduction layer and a second conduction layer. The first conduction layer is formed on the gate dielectric layer. The second conduction layer is formed above the first conduction layer. The sidewall spacers are formed adjacent to side walls of the gate electrode. An insulation layer is provided adjacent to the sidewall spacers, wherein an upper surface of the insulation layer and an upper surface of the second conduction layer are substantially at the same level.

BRIEF DESCRIPTION OF THE DRAWINGS

Embodiments of the invention are described with reference to the accompanying drawings which, for illustrative purposes, are schematic and not necessarily drawn to scale.

FIGS. 10(a) and 10(b) schematically shows cross-sectional views illustrating steps of a method for manufacturing a semiconductor device in a conventional example.

FIGS. 11(a) and 11(b) schematically shows cross-sectional views illustrating steps of a method for manufacturing a semiconductor device in a conventional example.

DETAILED DESCRIPTION

Figure 1:
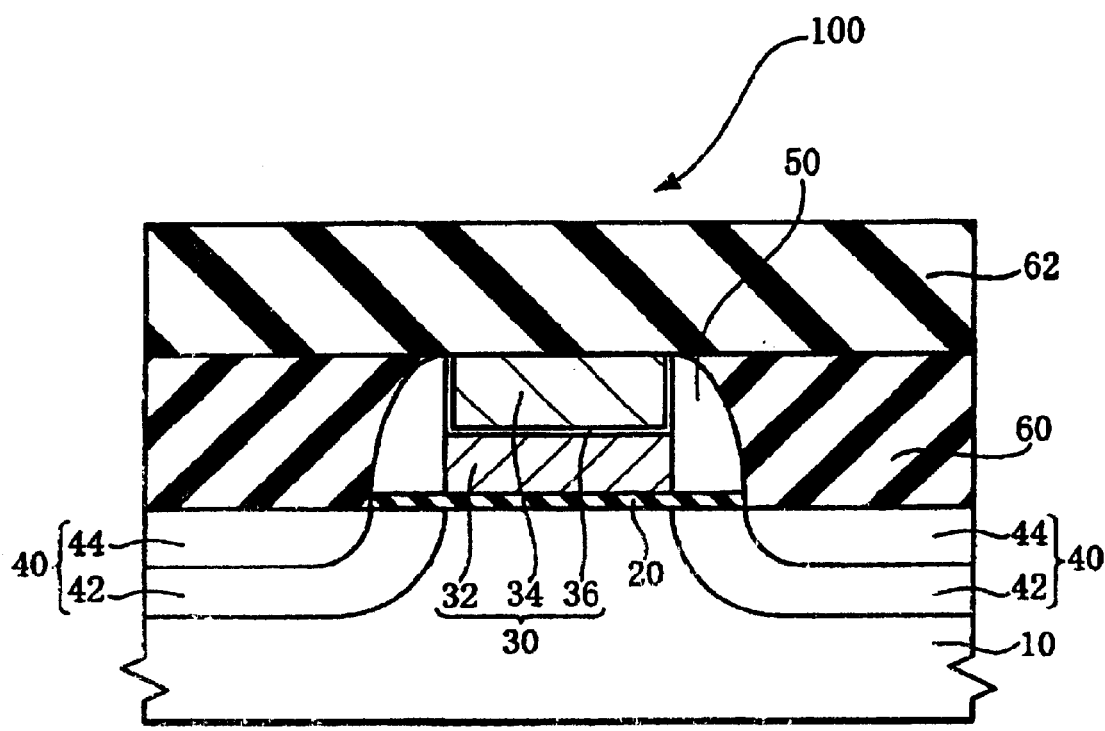
FIG. 1 schematically shows a cross-sectional view of a semiconductor device in accordance with an embodiment of the present invention.
Figure 2:
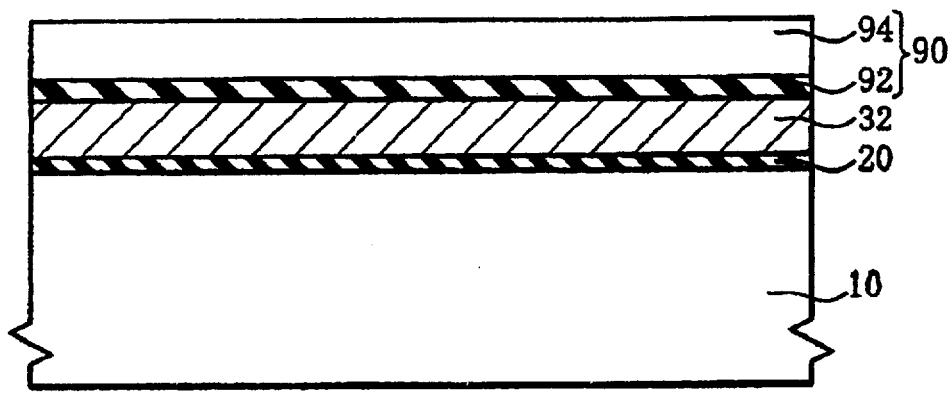
FIGS. 2(a) and 2(b) schematically shows cross-sectional views illustrating steps of a method for manufacturing a semiconductor device in accordance with an embodiment of the present invention.
Figure 2:
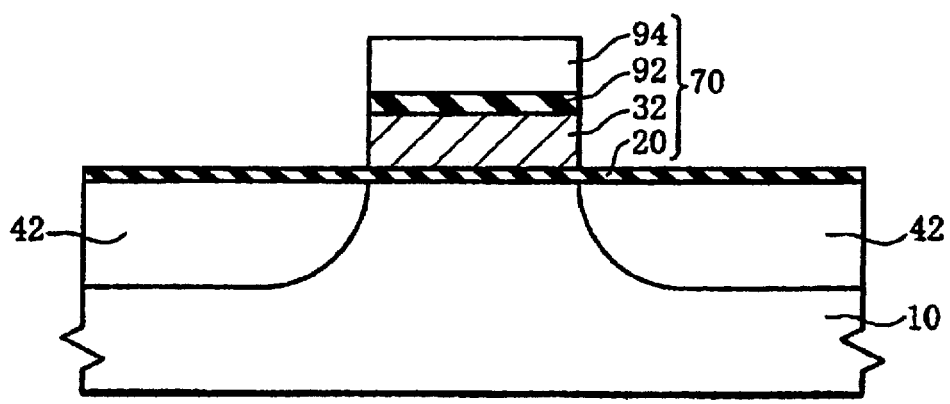
Figure 3:
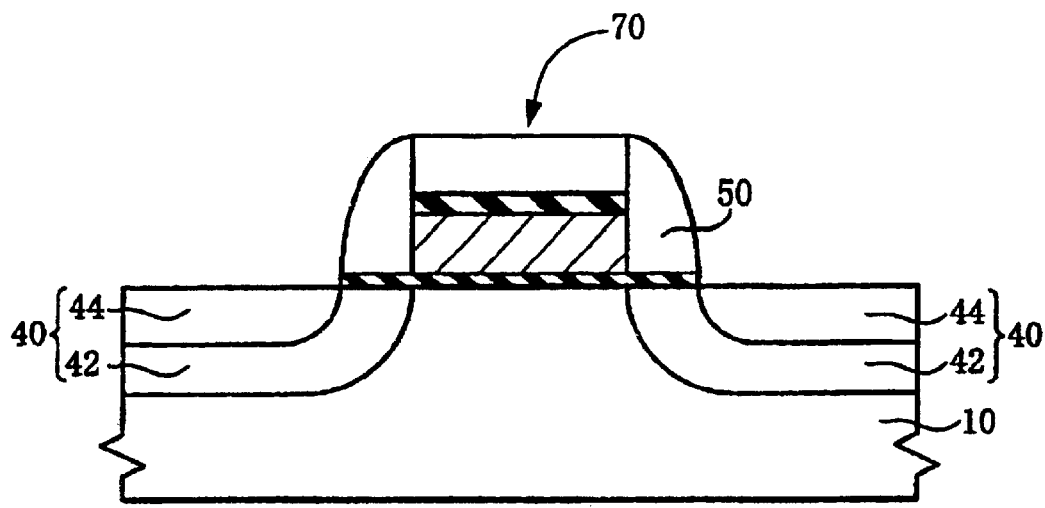
FIGS. 3(a) and 3(b) schematically shows cross-sectional views illustrating steps of a method for manufacturing a semiconductor device in accordance with an embodiment of the present invention.
Figure 3:
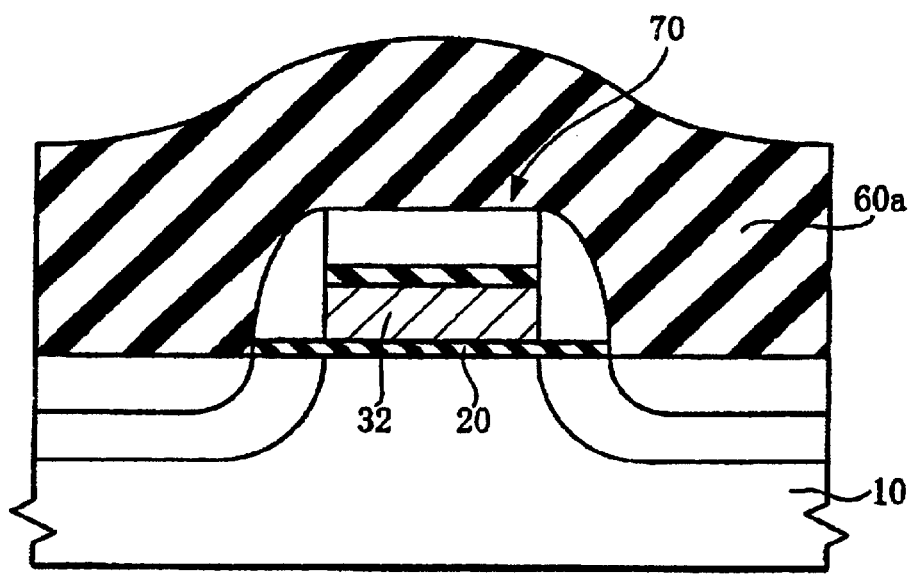
Figure 4:
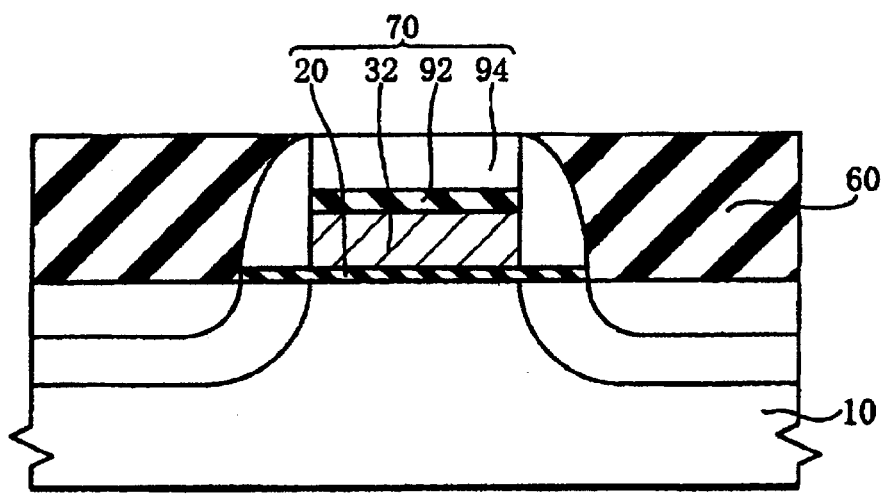
FIGS. 4(a) and 4(b) schematically shows cross-sectional views illustrating steps of a method for manufacturing a semiconductor device in accordance with an embodiment of the present invention.
Figure 4:
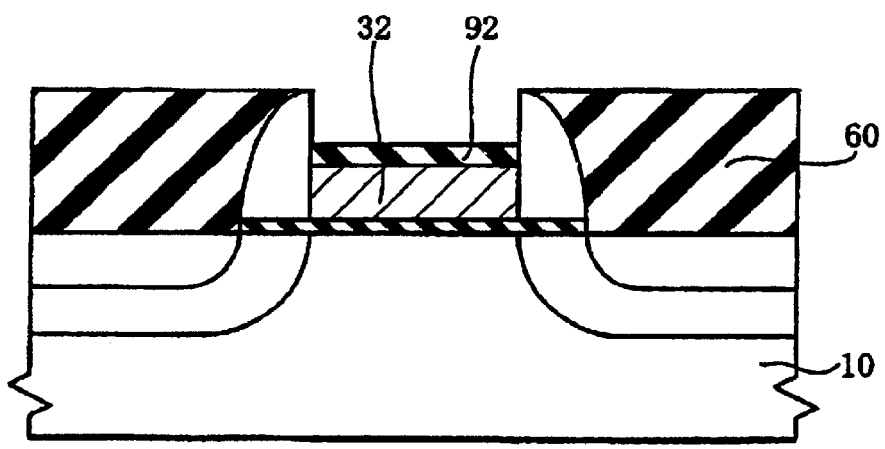
Figure 5:
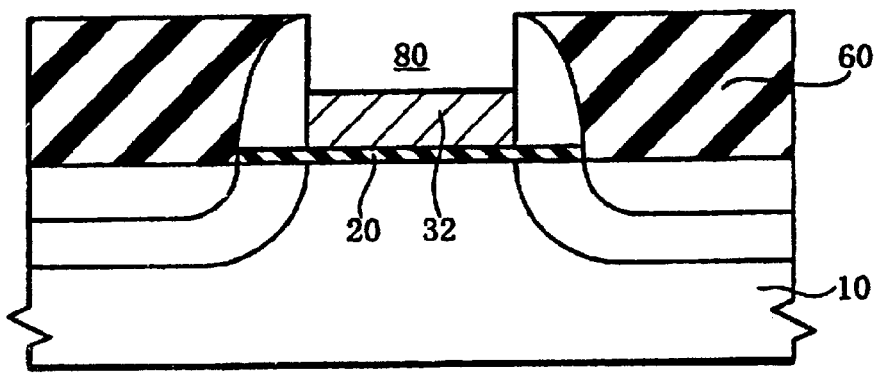
FIGS. 5(a) and 5(b) schematically shows cross-sectional views illustrating steps of a method for manufacturing a semiconductor device in accordance with an embodiment of the present invention.
Figure 5:
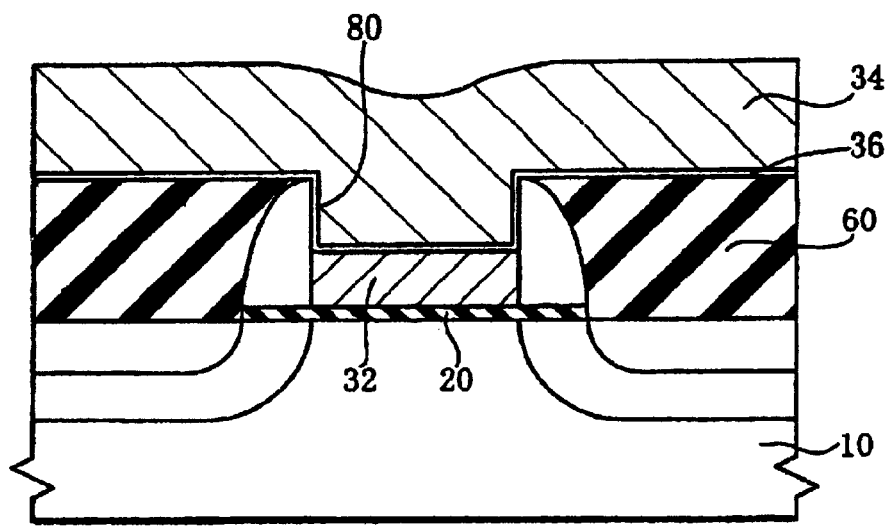

It is an object of certain embodiments of the present invention to provide semiconductor devices and methods for manufacturing the same in which deterioration of the electrical characteristics is suppressed.

A first method for manufacturing a semiconductor device in accordance with an embodiment of the present invention comprises the steps (a)–(j) of:

(a) forming a gate dielectric layer;

(b) forming a first conduction layer on the gate dielectric layer;

(c) forming a first upper layer composed of a material different from the first conduction layer on the first conduction layer;

(d) forming a second upper layer composed of a material different from the first upper layer on the first upper layer (e) forming sidewall spacers on side walls of the first conduction layer, the first upper layer and the second upper layer;

(f) forming an insulation layer that covers the second upper layer and the sidewall spacers;

(g) planarizing the insulation layer until an upper surface of the second upper layer is exposed;

(h) removing the second upper layer;

(i) removing the first upper layer to form a recessed section in an upper portion of the first upper layer; and (j) filling a second conduction layer in the recessed section to form a gate electrode that includes at least the first conduction layer and the second conduction layer.

The present embodiment may provide, for example, the following effects.

(1) In the present embodiment, in step (h) and step (i), the second upper layer and the first upper layer are removed to form a recessed section. The second upper layer is formed from a material different from the first upper layer. Therefore the second upper layer can be selectively removed against the first upper layer. In other words, in the removal of the second upper layer, the first upper layer may function as a stopper. Also, the first upper layer is formed from a material different from the first conduction layer. Therefore the first upper layer can be selectively removed against the first conduction layer. In other words, in the removal of the first upper layer, the first conduction layer may functioned as a stopper. As a result, in the removal of the first upper layer, the removal of the first conduction layer can be suppressed. Variations in the thickness of the first conduction layer can be suppressed to the extent that the removal of the first conduction layer is suppressed. Also, variations in the depth of the recessed section can be suppressed to the extent that variations of the first conduction layer are suppressed. Variations in the thickness of the second conduction layer can be suppressed to the extent that variations in the depth of the recessed section are suppressed. As a result, the first conduction layer and the second conduction layer can be accurately formed with respect to their thickness.

(2) In the present embodiment, in step (j), the second conduction layer is formed on the first conduction layer. Also, the source and drain regions can be formed before step (f). Therefore the second conduction layer can be formed after the formation of the source and drain regions. As a result, deterioration of the second conduction layer, which may occur when a resist layer that is provided for forming the source and drain regions is removed, may be prevented. Accordingly, deterioration of the second conduction layer can be suppressed. Also, in accordance with the present embodiment, a chemical agent that is incompatible with the second conduction layer, but that can securely remove the resist layer, can be selected. In view of the above, in accordance with the present embodiment, a semiconductor device in which deterioration of its electrical characteristics is suppressed can be formed.

(3) Also, in the present embodiment, when the recessed section is formed, the first conduction layer is not removed. Accordingly, in the removal step, the gate dielectric layer is not exposed. As a result, deterioration of the gate dielectric layer can be suppressed.

In the present embodiment, step (h) may be conducted by an etching method, and in step (h), a ratio of an etching rate of the second upper layer with respect to an etching rate of the first upper layer (an etching rate of the second upper layer/an etching rate of the first upper layer) may preferably be two or greater.

In the present embodiment, step (i) may be conducted by an etching method, and in the step (i), a ratio of an etching rate of the first upper layer with respect to an etching rate of the first conduction layer (an etching rate of the first upper layer/an etching rate of the first conduction layer) may preferably be two or greater.

Also, in the present embodiment, the first upper layer may be formed from silicon nitride and the second upper layer may be formed from polysilicon.

A second method for manufacturing a semiconductor device in accordance with an embodiment of the present invention comprises the steps (a)–(h) of:

(a) forming a gate dielectric layer;

(b) forming a first conduction layer on the gate dielectric layer;

(c) forming an upper layer on the first conduction layer, at least a lower portion of the upper layer being composed of a material different from at least an upper portion of the first conduction layer;

(d) forming sidewall spacers on side walls of the first conduction layer and the upper layer;

(e) forming an insulation layer that covers the upper layer and the sidewall spacers;

(f) planarizing the insulation layer until an upper surface of the upper layer is exposed;

(g) removing the upper layer to form a recessed section in an upper portion of the first conduction layer; and (h) filling a second conduction layer in the recessed section to form a gate electrode that includes at least the first conduction layer and the second conduction layer.

In the present embodiment, in step (g), the upper layer is removed to form a recessed section. At least a lower portion of the upper layer is formed from a material different from at least an upper portion of the first conduction layer. Therefore the upper layer can be selectively removed against the first conduction layer. As a result, in the removal of the upper layer, the removal of the first conduction layer can be suppressed. Therefore the effects (1) provided by the first method embodiment for manufacturing semiconductor devices described above may be achieved.

Also, in accordance with the second method for manufacturing semiconductor devices described above, the effects (2) and (3) provided by the first method embodiment for manufacturing semiconductor devices may be achieved.

In the embodiments described above, the first conduction layer may be formed from a single layer or a plurality of layers. Also, the upper layer may be formed from a single layer or a plurality of layers.

Also, in the second method embodiment described above, step (g) may be conducted by an etching method, and in step (g), a ratio of an etching rate of at least the lower portion of the upper layer with respect to an etching rate of the at least upper portion of the first conduction layer may preferably be two or greater.

In the first and second method embodiments for manufacturing semiconductor devices described above, the first conduction layer may preferably be formed from a polysilicon layer. As a result, a variety of process techniques to be employed when a gate electrode is formed from a polysilicon layer can be employed.

In the first and second method embodiments for manufacturing semiconductor devices described above, the second conduction layer may preferably be formed from one of metal, a metal alloy and a metal compound.

A first semiconductor device in accordance with an embodiment of the present invention comprises:

a field effect transistor, the field effect transistor including a gate dielectric layer, a gate electrode, a sidewall spacer, a source region, and a drain region, wherein the gate electrode includes a first conduction layer and a second conduction layer, the first conduction layer is formed on the gate dielectric layer, the second conduction layer is formed above the first conduction layer, the sidewall spacer is formed on a side wall of the gate electrode, an insulation layer is provided on the side of the sidewall spacer, and a barrier layer is provided between the first conduction layer and the second conduction layer and between the second conduction layer and the sidewall spacer.

A second semiconductor device in accordance with an embodiment of the present invention comprises:

a field effect transistor, the field effect transistor including a gate dielectric layer, a gate electrode, a sidewall spacer, a source region, and a drain region, wherein the gate electrode includes a first conduction layer and a second conduction layer, the first conduction layer is formed on the gate dielectric layer, the second conduction layer is formed above the first conduction layer, the sidewall spacer is formed on a side wall of the gate electrode, and an insulation layer is provided on the side of the sidewall spacer, wherein an upper surface of the insulation layer and an upper surface of the second conduction layer are substantially at the same level.

It is noted that "substantially at the same level" means that they are substantially at the same height from the upper surface of the gate dielectric layer.

In the first and second semiconductor device embodiments described above, the first conduction layer may be formed from a polysilicon layer.

In the first and second semiconductor device embodiments described above, the second conduction layer may be formed from one of metal, a metal alloy and a metal compound.

Certain preferred embodiments of the present invention are described below with reference to the accompanying drawings.

A semiconductor device in accordance with an embodiment of the present invention is described below. FIG. 1 schematically shows a cross-sectional view of a semiconductor device in accordance with the present embodiment. More specifically, a semiconductor device 100 has a structure as follows.

A gate dielectric layer 20 is formed on a silicon substrate 10. A gate electrode 30 is formed on the gate dielectric layer 20. The gate electrode 30 is formed from a first polysilicon layer (first conduction layer) 32, a barrier layer 36 and a metal layer (second conduction layer) 34 successively deposited on top of the other over the gate dielectric layer 20. Sidewall spacers 50 are formed on both sides of the gate electrode 30. Also, the barrier layer 36 is preferably also formed between the sidewall spacers 50 and the metal layer 34. It is noted that the barrier layer 36 has a function to inhibit or prevent metal of the metal layer 34 from diffusing into the polysilicon layer 32.

Source and drain regions 40 are formed in the silicon substrate 10 on the sides of the gate electrode 30. The source and drain regions 40 have a low concentration impurity diffusion layer 42 and a high concentration impurity diffusion layer 44. The low concentration impurity diffusion layer 42 is formed in a manner to enclose the high concentration impurity diffusion layer 44, in other words, has a double drain structure (double diffused drain). However, without being limited to this structure, the source and drain regions 40 can have other structures such as an LDD (lightly doped drain) structure.

A first interlayer dielectric layer 60 is formed on the sides of the gate electrode 30 with the sidewall spacers 50 being interposed therebetween. The upper surface of the metal layer 34 and the upper surface of the first interlayer dielectric layer 60 are substantially at the same level (height) as measured based on the upper surface of the gate dielectric layer 20. A second interlayer dielectric layer 62 is formed on the first interlayer dielectric layer 60.

A method for manufacturing a semiconductor device in accordance with an embodiment of the present invention is described below. FIG. 2 through FIG. 6 schematically show cross-sectional views in a process for manufacturing a semiconductor device in accordance with the present embodiment.

First, as shown in FIG. 2(a), a gate dielectric layer 20 is formed on a silicon substrate 10 by a known method.

Next, a first polysilicon layer 32 as a first conduction layer is formed on the gate dielectric layer 20. The first polysilicon layer 32 may be formed, for example, by a CVD method. The thickness of the polysilicon layer 32 is, for example, 50–500 nm.

Next, an upper layer 90 is formed on the first polysilicon layer 32. The upper layer 90 may have a stacked layered structure including a silicon nitride layer 92 and a second polysilicon layer 94. For example, the upper layer 90 may be formed as follows.

The silicon nitride layer 92 is formed on the first polysilicon layer 32. The silicon nitride layer 92 may be formed, for example, by a CVD method. The thickness of the silicon nitride layer 92 is determined in view of the thickness of the second polysilicon layer 94 and the like, and may be, for example, 10–50 nm.

Next, the second polysilicon layer 94 is formed on the silicon nitride layer 92. The thickness of the second polysilicon layer 94 is determined in view of the thickness of the silicon nitride layer 92 and the like, and may be, for example, 50–500 nm. It is noted that the thickness of the upper layer 90 (the total thickness of the silicon nitride layer 92 and the second polysilicon layer 94) is determined in view of the thickness of a desired second conduction layer 34.

Next, as shown in FIG. 2(b), the second polysilicon layer 94, the silicon nitride layer 92 and the first polysilicon layer 32 are patterned by lithography and etching. In this manner, a stacked layered body 70 is formed.

Next, a resist layer having a specified pattern is formed over the silicon substrate 10. Next, a low concentration impurity diffusion layer 42 is formed by ion-implanting an impurity in the silicon substrate 10 using the resist layer as a mask. Then, the resist layer is removed by an acid chemical agent.

Next, as shown in FIG. 3(a), sidewall spacers 50 are formed on both sides of the stacked layered body 70 by a known method. The material of the sidewall spacers can be for example silicon oxide, silicon nitride or the like. Next, a resist layer having a specified pattern is formed on the silicon substrate 10. Next, an impurity is ion-implanted in the silicon substrate 10 using the resist layer as a mask to form a high concentration impurity diffusion layer 44. Then, the resist layer is removed by an acid chemical agent. As a result, source and drain regions 40 are formed.

Next, as shown in FIG. 3(b), an insulation layer 60a is formed over the silicon substrate 10 in a manner to cover the stacked layered body 70 and the sidewall spacers 50. The insulation layer 60a can be formed, for example, by a CVD method. Silicon oxide can be used as the material of the insulation layer 60a. The thickness of the insulation layer 60a is determined in view of the thickness of the stacked layered body 70, and may be, for example, 150–1500 nm.

Next, as shown in FIG. 4(a), the insulation layer 60a is planarized. In this manner, a first insulation layer 60 is formed. The insulation layer 60a is planarized until the upper surface of the stacked layered body 70 is exposed. The insulation layer 60a may be planarized by, for example, a chemical-mechanical polishing method.

Next, as shown in FIG. 4(b), the second polysilicon layer 94 is selectively etched against the silicon nitride layer 92. In other words, in this etching, the silicon nitride layer 92 functions as an etching stopper. As a result, in the etching of the second polysilicon layer 94, the first polysilicon layer 32 is not etched. In the etching, a ratio of an etching rate of the second polysilicon layer with respect to an etching rate of the silicon nitride layer 92 (an etching rate of the second polysilicon layer 94/an etching rate of the silicon nitride layer 92) may be two or greater, and more preferably five or greater.

Next, as shown in FIG. 5(a), the silicon nitride layer 92 is selectively etched against the first polysilicon layer 32. In this manner, a recessed section 80 is formed between the sidewall spacers 50 on the first polysilicon layer 32. In this etching, a ratio of an etching rate of the silicon nitride layer 92 with respect to an etching rate of the first polysilicon layer 32 (an etching rate of the silicon nitride layer 92/an etching rate of the first polysilicon layer 32) may be two or greater, and more preferably five or greater.

Next, as shown in FIG. 5(b), a barrier layer 36 is preferably formed over the entire surface. By forming the barrier layer 36 over the surface, the upper surface of the first polysilicon layer 32 is covered by the barrier layer 36. For example, titanium nitride, titanium tungsten, tungsten nitride, and tantalum nitride can be listed as the material of the barrier layer 36. The barrier layer 36 can be formed by, for example, a CVD method.

Next, a metal layer 34 is preferably deposited over the entire surface, to fill the recessed section 80. For example, tungsten, aluminum, copper, an alloy of aluminum and copper, and a compound of silicon and metal may be used as the material of the metal layer 34. For example, titanium silicide, tungsten silicide, cobalt silicide, molybdenum silicide or the like may be used as the compound of silicon and metal. The metal layer 34 can be formed by, for example, a CVD method.

Figure 6:
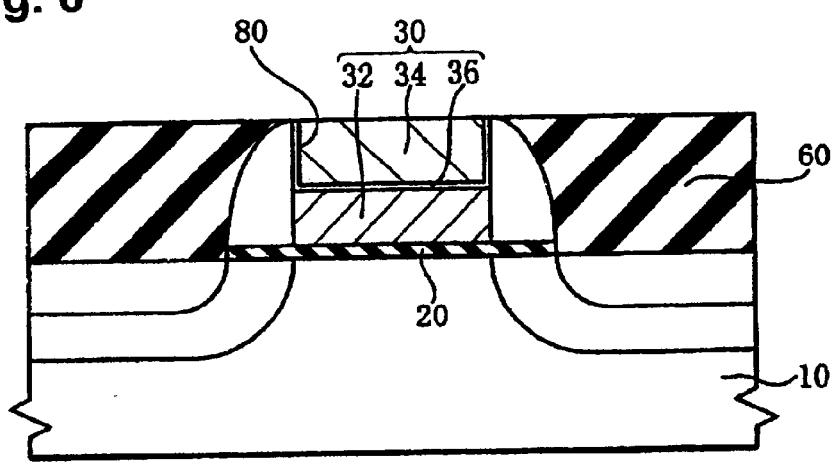
FIG. 6 schematically shows a cross-sectional view illustrating one step of a method for manufacturing a semiconductor device in accordance with an embodiment of the present invention.

Next, as shown in FIG. 6, the metal layer 34 is planarized in a manner that the metal layer 34 remains only in the recessed section 80. As a result, a gate electrode 30 is formed. The metal layer 34 can be planarized by, for example, a chemical-mechanical polishing method. In this planarization, the barrier layer 36 on the first insulation layer 60 is also removed.

Next, as shown in FIG. 1, a second insulation layer 70 is formed on the first insulation layer 60 and the metal layer 34 by a known method. In the manner described above, the semiconductor device 100 is manufactured.

The present embodiment may have the effects described below.

(1) The recessed section 80 is formed by etching the second polysilicon layer 94 and the silicon nitride layer 92. When the silicon nitride layer 92 is etched, the silicon nitride layer 92 is selectively etched against the first polysilicon layer 32. As a result, in the etching of the silicon nitride layer 92, variations in the thickness of the first polysilicon layer 32 can be suppressed to the extent that the first polysilicon layer 32 is more difficult to be etched. Also, the fact that variations in the thickness of the first polysilicon layer 32 are suppressed means that variations in the depth of the recessed section 80 are suppressed. Because variations in the depth of the recessed section 80 are suppressed, variations in the thickness on the second conduction layer 34 can be suppressed. As a result, in accordance with the present embodiment, the first polysilicon layer 32 and the metal layer 34 can be accurately formed in terms of their thickness.

(2) The manufacturing method of the present embodiment of the present invention is particularly useful when manufacturing a semiconductor device having a gate electrode with its gate width being different from one location to another.

(3) Because the second polysilicon layer 94 is formed on the silicon nitride layer 92, the thickness of the silicon nitride layer 92 can be reduced accordingly. Because the thickness of the silicon nitride layer 92 can be reduced, the etching time for the silicon nitride layer 92 can be shortened. As a result, deteriorating effects of the etching of the silicon nitride layer 92 are suppressed from reaching the first polysilicon layer 32.

(4) The present embodiment includes the step of etching the second polysilicon layer 94 and the silicon nitride layer 92 to form a recessed section 80. However, the first polysilicon layer 32 is not removed. As a result, in forming the recessed section 80, the gate dielectric layer 20 is not exposed. Accordingly, the gate dielectric layer 20 is inhibited or prevented from being damaged.

(5) In the present embodiment, the first polysilicon layer 32 is formed in a manner to contact the gate dielectric layer 20 at the gate electrode 30. As a result, a variety of process techniques to be employed when a gate electrode 30 is formed from polysilicon can be used. It is noted that, when the first polysilicon layer 32 is entirely removed such that the gate electrode is formed only from a metal layer, a work function difference between the gate electrode and the silicon substrate becomes greater compared to when the gate electrode includes silicon. As a result, when the gate electrode is formed only from a metal layer, a variety of process techniques to be employed when a gate electrode is formed from silicon are difficult to be employed.

(6) A MOS transistor with its gate electrode having a stacked layered structure of a polysilicon layer and a metal layer can be formed, for example, in the following manner.

Figure 7:
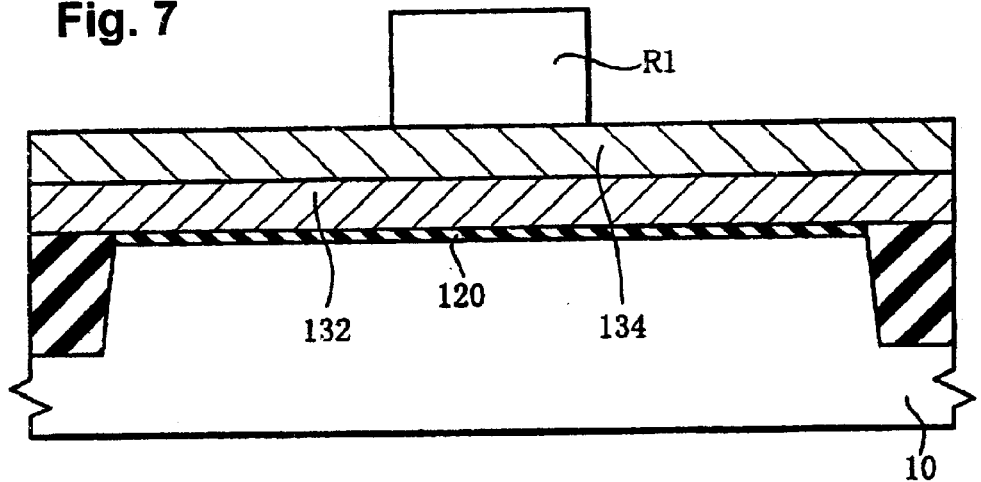
FIG. 7 schematically shows a cross-sectional view illustrating one step of a method for manufacturing a semiconductor device in accordance with an example for comparing the effects.

First, as shown in FIG. 7, a gate dielectric layer 120, a polysilicon layer 132 and a metal layer 134 are successively deposited on a silicon substrate 10. Next, a resist layer R1 is formed on the metal layer 134. Next, the metal layer 134 and the polysilicon layer 132 are etched using the resist layer R1 as a mask, to form a gate electrode 130. Then, the resist layer R1 is removed.

Figure 8:
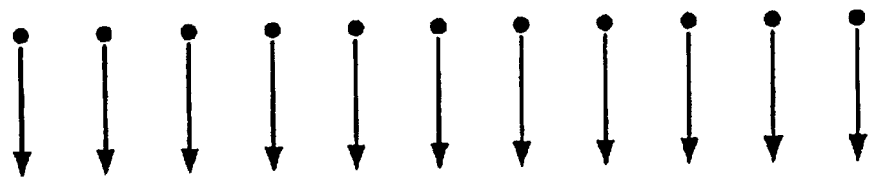
FIG. 8 schematically shows a cross-sectional view illustrating one step of a method for manufacturing a semiconductor device in accordance with an example for comparing the effects.
Figure 8:
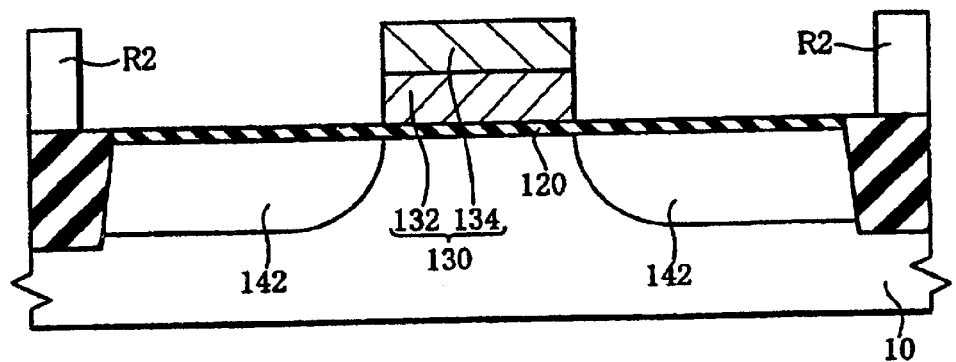

Next, as shown in FIG. 8, a resist layer R2 having a specified pattern is formed over the silicon substrate 10. Next, an impurity is ion-implanted in the silicon substrate 10 using the resist layer R2 as a mask, to form a low concentration impurity diffusion layer 142. Then, the resist layer R2 is removed.

Figure 9:
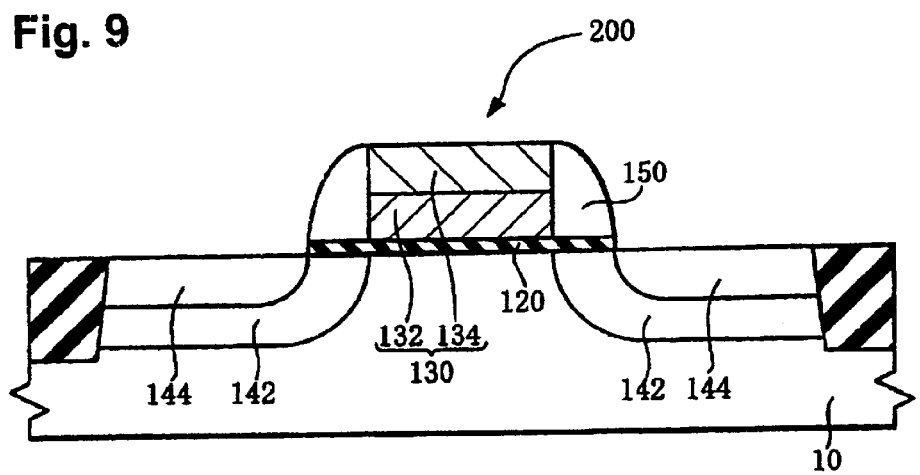
FIG. 9 schematically shows a cross-sectional view illustrating one step of a method for manufacturing a semiconductor device in accordance with an example for comparing the effects.

Next, as shown in FIG. 9, sidewall spacers 150 are formed on side walls of the gate electrode 130. Next, a resist layer having a specified pattern is formed on the silicon substrate 10. Next, an impurity is ion-implanted in the silicon substrate using the resist layer as a mask, to form a high concentration impurity diffusion layer 144. Then, the resist layer is removed. In this manner, a MOS transistor 200 is manufactured.

It is noted that the resist layers (the resist layer R1 for forming the gate electrode and the resist layer R2 for forming the impurity diffusion layer) may preferably be removed by an acid chemical agent (for example, sulfuric acid). However, when an acid chemical agent is used for removing the resist layers, the metal layer 134 is exposed to the acid chemical agent, and the metal layer 134 is corroded. When the metal layer 134 is corroded, the electrical characteristic of the semiconductor device deteriorates. Therefore, when the gate electrode 130 includes a metal layer 134, it is difficult to use an acid chemical agent. On the other hand, although the use of a chemical agent other than an acid chemical agent may be considered, it is difficult to securely remove the resist layer with such a chemical agent.

However, in accordance with the present embodiment, the metal layer 34 is formed after the source and drain regions 40 are formed. As a result, when the resist layer that is provided for forming the source and drain regions 40 is removed, an acid chemical agent (for example, sulfuric acid) can be used.

The present invention is not limited to the embodiments described above, and many modifications can be made within the scope that does not depart from the subject matter of the present invention.

The above-described embodiments may be modified, for example, in the following manner.

(1) In the above-described embodiment, the first conduction layer is formed only from the polysilicon layer 32. However, the first conduction layer is not particularly limited to such a structure as long as it has a structure in which the upper portion of the first conduction layer is difficult to be etched (for example, in terms of the material and etchant) compared to the lower portion of the upper layer. More concretely, without being particularly limited, the first conduction layer may have a structure, in the etching of the lower portion of the upper layer, in which a ratio of an etching rate of the lower portion of the upper layer with respect to an etching rate of the upper portion of the first conduction layer may preferably be two or greater, and more preferably be five or greater.

(2) In the above-described embodiment, the upper layer 90 is formed from the silicon nitride layer 92 and the second polysilicon layer 94. However, the upper layer 90 is not limited to this structure, but may, for example, be formed from only a silicon nitride layer. In other words, without being particularly limited, the upper layer may have a structure that is more readily etched compared to the upper portion of the first conduction layer (for example, in terms of the material and etchant) in the etching of the lower portion of the upper layer.

(3) In the above-described embodiment, the barrier layer 36 is formed after the recessed section 80 is formed. However, without being limited to this embodiment, a barrier layer may be formed in the stage in which the stacked layered body 70 is formed. In other words, the barrier layer can be formed as an uppermost layer of the first conduction layer.

The present invention is not limited to the embodiments described above, and many modifications can be made within the scope that does not depart from the subject matter of the present invention.

What is claimed:
1. A method for manufacturing a semiconductor device, the method comprising the steps of:
   (a) forming a gate dielectric layer;
   (b) forming a first conductive layer on the gate dielectric layer;

(c) forming a first upper layer comprising a material different from the first conductive layer on the first conductive layer;

(d) forming a second upper layer comprising a material different from the first upper layer on the first upper layer;

(e) forming sidewall spacers on side walls of the first conductive layer, the first upper layer and the second upper layer;

(f) forming an insulation layer that covers the second upper layer and the sidewall spacers;

(g) planarizing the insulation layer until an upper surface of the second upper layer is exposed;

(h) removing the second upper layer;

(i) removing the first upper layer to form a recessed section between the sidewall spacers; and (j) forming a second conductive layer in the recessed section to form a gate electrode that includes at least the first conductive layer and the second conductive layer.

2. A method for manufacturing a semiconductor device according to claim 1, wherein the step (h) is conducted by an etching method, and in the step (h), a ratio of an etching rate of the second upper layer with respect to an etching rate of the first upper layer is two or greater.

3. A method for manufacturing a semiconductor device according to claim 1, wherein the step (i) is conducted by an etching method, and in the step (i), a ratio of an etching rate of the first upper layer with respect to an etching rate of the first conductive layer is two or greater.

4. A method for manufacturing a semiconductor device according to claim 1, wherein the first upper layer is formed from silicon nitride and the second upper layer is formed from polysilicon.

5. A method for manufacturing a semiconductor device according to claim 1, further comprising, after step (i), forming a barrier layer between the first conductive layer and the second conductive layer.

6. A method for manufacturing a semiconductor device according to claim 1, further comprising, after step (i), forming a barrier layer between the first conductive layer and the second conductive layer, and forming the barrier layer between the second conductive layer and the sidewall spacers.

7. A method for manufacturing a semiconductor device, the method comprising the steps of:

(a) forming a gate dielectric layer;

(b) forming a first conductive layer on the gate dielectric layer;

(c) forming an upper layer on the first conductive layer, at least a lower portion of the upper layer comprising a material different from at least an upper portion of the first conductive layer;

(d) forming sidewall spacers on side walls of the first conductive layer and the upper layer;

(e) forming an insulation layer that covers the upper layer and the sidewall spacers;

(f) planarizing the insulation layer until an upper surface of the upper layer is exposed;

(g) removing the upper layer to form a recessed section between the sidewall spacers on the upper portion of the first conductive layer; and (h) forming a second conductive layer in the recessed section to form a gate electrode that includes at least the first conductive layer and the second conductive layer.

8. A method for manufacturing a semiconductor device according to claim 7, wherein the step (g) is conducted by an etching method, and in the step (g), a ratio of an etching rate of at least the lower portion of the upper layer with respect to an etching rate of the at least upper portion of the first conductive layer is two or greater.

9. A method for manufacturing a semiconductor device according to claim 7, wherein the first conductive layer is formed from a polysilicon layer.

10. A method for manufacturing a semiconductor device according to claim 7, wherein the second conductive layer comprises a material selected from the group consisting of a metal, a metal alloy and a metal compound.

11. A method for manufacturing a semiconductor device according to claim 7, further comprising, after step (g), forming a barrier layer between the first conductive layer and the second conductive layer.

12. A method for manufacturing a semiconductor device according to claim 7, further comprising, after step (g), forming a barrier layer between the first conductive layer and the second conductive layer, and forming the barrier layer between the second conductive layer and the sidewall spacers.

13. A method for manufacturing a semiconductor device, the method comprising:

forming a gate dielectric layer;

forming a first conductive layer on the gate dielectric layer;

forming an upper layer on the first conductive layer, the upper layer comprising a material different from that of the first conductive layer;

forming sidewall spacers on side walls of the first conductive layer and the upper layer;

removing the upper layer to form a recessed section between the sidewall spacers and above at least part of the first conductive layer; and forming a second conductive layer in the recessed section to form a gate electrode comprising the at least part of the first conductive layer and the second conductive layer.

14. A method for manufacturing a semiconductor device according to claim 13, further comprising, after the removing the upper layer and prior to forming the second conductive layer, forming a barrier layer on the first conductive layer.

15. A method for manufacturing a semiconductor device according to claim 13, further comprising, after the removing the upper layer and prior to the forming a second conductive layer, forming a barrier layer on the first conductive layer and the sidewall spacers, wherein the barrier layer will be positioned between the first conductive layer and the second conductive layer and between the sidewall spacers and the second conductive layer.

16. A method for manufacturing a semiconductor device according to claim 13, wherein the first conductive layer and second conductive layer comprises materials having different compositions.

17. A method for manufacturing a semiconductor device according to claim 13, wherein the first conductive layer comprises polysilicon and the second conductive layer comprises a material selected from the group consisting of a metal, a metal alloy and a metal compound.

18. A method for manufacturing a semiconductor device according to claim 1, wherein the second upper layer and the first conductive layer are formed from an identical material.

19. A method for manufacturing a semiconductor device according to claim 1, wherein the second upper layer and the first conductive layer each comprise polysilicon.

20. A method for manufacturing a semiconductor device according to claim 7, further comprising forming the upper layer to include an upper portion, and wherein the upper portion and the first conductive layer are formed from an identical material.

21. A method for manufacturing a semiconductor device according to claim 14, further comprising:
   forming the first conductive layer from a material comprising polysilicon,
   forming the upper layer to include a lower portion formed from silicon nitride and an upper portion formed from polysilicon, and
   forming the second conductive layer from a material selected from the group consisting of a metal, a metal alloy, and a metal compound.

22. A method for manufacturing a semiconductor device according to claim 21, wherein the second conductive layer is formed from at least one material selected from the group consisting of tungsten, aluminum, copper, titanium silicide, tungsten silicide, cobalt silicide and molybdenum silicide.

23. A method for manufacturing a semiconductor device, the method comprising:
   forming a gate dielectric layer on a silicon substrate;
   forming a first conductive layer on the gate dielectric layer;
   forming a first upper layer comprising a silicon nitride layer on the first conductive layer;
   forming a second upper layer comprising a polysilicon layer on the first upper layer, wherein the first upper layer is positioned between the first conductive layer and the second upper layer;
   patterning and etching the first conductive layer, the first upper layer and the second upper layer so that the first conductive layer, the first upper layer and the second upper layer all have an identical width defined by side end surfaces;
   after the patterning and etching, forming sidewall spacers on the side end surfaces of the first upper conductive layer, the first upper layer and the second upper layer;
   after the forming sidewall spacers, forming an insulation layer over the second upper layer and the sidewall spacers;
   planarizing the insulation layer until an upper surface of the second upper layer is exposed;
   after the planarizing, removing the second upper layer and removing the first upper layer from between the sidewall spacers, while at least part of the first conductive layer remains between the sidewall spacers, wherein the removing the second upper layer and the removing the first upper layer forms an opening between the sidewall spacers; and
   forming a second conductive layer in the opening between the sidewall spacers to form a gate electrode that includes at least the first conductive layer and the second conductive layer.

24. A method as in claim 23, further comprising forming the first conductive layer from a material comprising polysilicon, forming the first upper layer from a material comprising silicon nitride, and forming the second upper layer from a material comprising polysilicon.

25. A method as in claim 23, further comprising, after the removing the second upper layer and removing the first upper layer from between the sidewall spacers, and prior to the forming a second conductive layer in the opening, forming a barrier layer in the opening so that the barrier layer is in direct contact with the first conductive layer and an interior surface of the sidewall spacers.

* * * * *